United States Patent
Hsu et al.

(10) Patent No.: US 12,556,189 B2
(45) Date of Patent: Feb. 17, 2026

(54) CLOCK SIGNAL GENERATION CIRCUIT AND CLOCK SIGNAL GENERATION METHOD THEREOF

(71) Applicant: NANYA TECHNOLOGY CORPORATION, New Taipei (TW)

(72) Inventors: Hao-Huan Hsu, New Taipei (TW); Chia Hui Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/780,514

(22) Filed: Jul. 23, 2024

(65) Prior Publication Data

US 2026/0031825 A1 Jan. 29, 2026

(51) Int. Cl.
*H03L 7/099* (2006.01)
*H03L 7/08* (2006.01)
*H03L 7/087* (2006.01)

(52) U.S. Cl.
CPC .......... *H03L 7/0991* (2013.01); *H03L 7/0802* (2013.01); *H03L 7/087* (2013.01)

(58) Field of Classification Search
None
See application file for complete search history.

(56) References Cited

U.S. PATENT DOCUMENTS

| | | | |
|---|---|---|---|
| 5,126,695 A | 6/1992 | Abe | |
| 5,982,241 A | 11/1999 | Nguyen et al. | |
| 7,688,929 B2 * | 3/2010 | Co | H03C 3/0966 327/147 |
| 8,433,020 B2 * | 4/2013 | Buchwald | H03L 7/0816 327/158 |
| 8,749,289 B2 * | 6/2014 | Li | H03B 5/364 327/293 |
| 8,774,336 B2 * | 7/2014 | Bae | H04L 7/00 375/354 |
| 8,798,219 B2 * | 8/2014 | Buchwald | H04L 25/03885 375/373 |
| 9,281,805 B2 * | 3/2016 | Tomita | H03K 3/012 |

(Continued)

FOREIGN PATENT DOCUMENTS

| | | | | |
|---|---|---|---|---|
| CN | 118199622 A | * | 6/2024 | H03K 5/14 |
| EP | 0316943 | | 5/1989 | |

(Continued)

OTHER PUBLICATIONS

Z. Wang, Y. Zhang, Y. Onizuka and P. R. Kinget, "Multi-Phase Clock Generation for Phase Interpolation With a Multi-Phase, Injection-Locked Ring Oscillator and a Quadrature DLL," in IEEE Journal of Solid-State Circuits, vol. 57, No. 6, pp. 1776-1787, Jun. 2022, (Year: 2022).*

(Continued)

*Primary Examiner* — Berhanu Tadese
(74) *Attorney, Agent, or Firm* — JCIPRNET

(57) ABSTRACT

A clock signal generation circuit and a clock signal generation method thereof are provided. When an analog clock signal generator circuit does not provide an output clock signal, a control circuit controls a multiplexer circuit to selectively output an oscillator signal provided by an oscillator circuit to the analog clock signal generator circuit, and controls a clock path circuit to stop transmitting an input clock signal.

10 Claims, 2 Drawing Sheets

(56) References Cited

U.S. PATENT DOCUMENTS

| | | | |
|---|---|---|---|
| 9,312,865 B2 * | 4/2016 | Song | H03L 7/0807 |
| 9,698,764 B2 * | 7/2017 | Neidengard | H03K 23/588 |
| 12,316,327 B2 * | 5/2025 | Chaturvedi | G06F 1/08 |
| 12,381,706 B2 * | 8/2025 | Familia | H04L 7/0091 |
| 2002/0140486 A1 * | 10/2002 | Boerstler | H03L 7/0995 327/291 |
| 2009/0009228 A1 * | 1/2009 | Jang | H03K 5/133 327/295 |
| 2021/0111727 A1 | 4/2021 | Pahkala et al. | |
| 2022/0200781 A1 * | 6/2022 | Kundu | H03L 7/087 |
| 2023/0318608 A1 | 10/2023 | Uehara et al. | |
| 2024/0313785 A1 * | 9/2024 | Baier | H03L 7/0814 |
| 2025/0211211 A1 * | 6/2025 | Gaurav | H03K 3/012 |

FOREIGN PATENT DOCUMENTS

| | | | | |
|---|---|---|---|---|
| EP | 2104232 | A2 * | 9/2009 | H04L 7/0337 |
| EP | 4432566 | A1 * | 9/2024 | H03L 7/24 |
| EP | 3843270 | B1 * | 5/2025 | G06F 1/06 |
| JP | 2001273048 | A * | 10/2001 | H03K 5/131 |
| JP | 2002123330 | | 4/2002 | |
| JP | 2005135368 | | 5/2005 | |
| JP | 7702029 | B1 * | 7/2015 | H03K 5/14 |
| KR | 20170083414 | A * | 7/2017 | H03K 19/018507 |
| KR | 20220101107 | A * | 7/2022 | H03L 7/099 |
| KR | 20240046901 | A * | 4/2024 | H03K 5/00006 |
| TW | 202121847 | | 6/2021 | |
| WO | WO-2015041645 | A1 * | 3/2015 | H03K 23/588 |
| WO | WO-2017150241 | A1 * | 9/2017 | H03L 7/081 |
| WO | WO-2021101605 | A1 * | 5/2021 | H03L 7/081 |
| WO | WO-2021202451 | A1 * | 10/2021 | H03K 5/15013 |

OTHER PUBLICATIONS

"Office Action of Germany Counterpart Application", issued on Jun. 30, 2025, p. 1-p. 17.

"Office Action of Taiwan Counterpart Application", issued on Jul. 2, 2025, p. 1-p. 8.

* cited by examiner

CLOCK SIGNAL GENERATION CIRCUIT AND CLOCK SIGNAL GENERATION METHOD THEREOF

BACKGROUND

Technical Field

The disclosure relates to a clock signal generation device, and particularly relates to a multi-phase clock signal generation circuit and a clock signal generation method thereof.

Description of Related Art

Generally speaking, memory devices often use multi-phase clock signals provided by multi-phase clock circuits to serialize or deserialize data signals to achieve high-speed read/write operations. The multi-phase clock circuit may be, for example, a 4-phase analog clock generator circuit, which is used to generate 4-phase clock signals. When the 4-phase analog clock generator circuit does not need to output clock signals and the 4-phase clock generator circuit is in the power-off mode, the clock signals still need to be continuously provided to the 4-phase clock generator through the clock path circuit, so that the 4-phase clock generator circuit can return to the normal mode and still operate normally. However, since the clock path circuit usually includes relatively power-consuming circuit components, such as a buffer, it will cause considerable power consumption by continuously configuring the clock path circuit to provide the clock signals to the 4-phase clock generator.

SUMMARY

The disclosure provides a clock signal generation circuit and a clock signal generation method thereof, which can effectively and significantly reduce the power consumption of the clock signal generation circuit.

A clock signal generation circuit of the disclosure includes a receiver circuit, a clock path circuit, an oscillator circuit, a multiplexer circuit, an analog clock signal generator circuit, and a control circuit. The receiver circuit receives an input clock signal. The clock path circuit is coupled to the receiver circuit and transmits the input clock signal. The oscillator circuit provides an oscillator signal with a same frequency as the input clock signal. An input terminal of the multiplexer circuit is coupled to the clock path circuit and the oscillator circuit. The analog clock signal generator circuit is coupled to an output terminal of the multiplexer circuit and provides an output clock signal. The control circuit is coupled to the clock path circuit and the multiplexer circuit. When the analog clock signal generator circuit does not provide the output clock signal, the multiplexer circuit is controlled to selectively output the oscillator signal to the analog clock signal generator circuit and the clock path circuit is controlled to stop transmitting the input clock signal.

In an embodiment of the disclosure, an input terminal of the oscillator circuit is coupled to an input terminal of the clock path circuit to generate the oscillator signal based on the input clock signal.

In an embodiment of the disclosure, the oscillator circuit includes an annular oscillator circuit or an injection locked oscillator circuit.

In an embodiment of the disclosure, the analog clock signal generator circuit includes a 4-phase analog clock signal generator circuit.

In an embodiment of the disclosure, when the analog clock signal generator circuit enters an idle mode or a power-off mode, the control circuit determines that the analog clock signal generator circuit does not provide the output clock signal.

The invention also provides a clock signal generation method of a clock signal generation circuit. The clock signal generation circuit includes a clock path circuit, an oscillator circuit, a multiplexer circuit, and an analog clock signal generator circuit. The clock path circuit and the oscillator circuit are coupled to an input terminal of the multiplexer circuit. An output terminal of the oscillator circuit is coupled to the analog clock signal generator circuit. The clock path circuit is configured to transmit an input clock signal. The clock signal generation method of the clock signal generation circuit includes the following steps. It is determined whether the analog clock signal generator circuit provides an output clock signal. In response to the analog clock signal generator circuit providing the output clock signal, the multiplexer circuit is controlled to selectively output the input clock signal to the analog clock signal generator circuit. In response to the analog clock signal generator circuit not providing the output clock signal, the multiplexer circuit is controlled to selectively output an oscillator signal to the analog clock signal generator circuit, and the clock path circuit is controlled to stop transmitting the input clock signal.

In an embodiment of the disclosure, an input terminal of the oscillator circuit receives the input clock signal to generate the oscillator signal based on the input clock signal.

In an embodiment of the disclosure, the oscillator circuit includes an annular oscillator circuit or an injection locked oscillator circuit.

In an embodiment of the disclosure, the analog clock signal generator circuit includes a 4-phase analog clock signal generator circuit.

In an embodiment of the disclosure, when the analog clock signal generator circuit enters an idle mode or a power-off mode, it is determined that the analog clock signal generator circuit does not provide the output clock signal.

Based on the above, the control circuit of the embodiment of the disclosure can control the multiplexer circuit to selectively output the oscillator signal provided by the oscillator circuit to the analog clock signal generator circuit when the analog clock signal generator circuit does not provide the output clock signal, and control the clock path circuit to stop transmitting the input clock signal. In this way, when the analog clock signal generator circuit does not provide the output clock signal, the oscillator circuit is used instead of the clock path circuit to provide the oscillator signal with the same frequency as the input clock signal to the analog clock signal generator circuit, thereby effectively reducing the power consumption of the clock signal generation circuit.

In order to make the above-mentioned features and advantages of the disclosure clearer and easier to understand, the following embodiments are given and described in details with accompanying drawings as follows.

DESCRIPTION OF THE EMBODIMENTS

Figure 1:
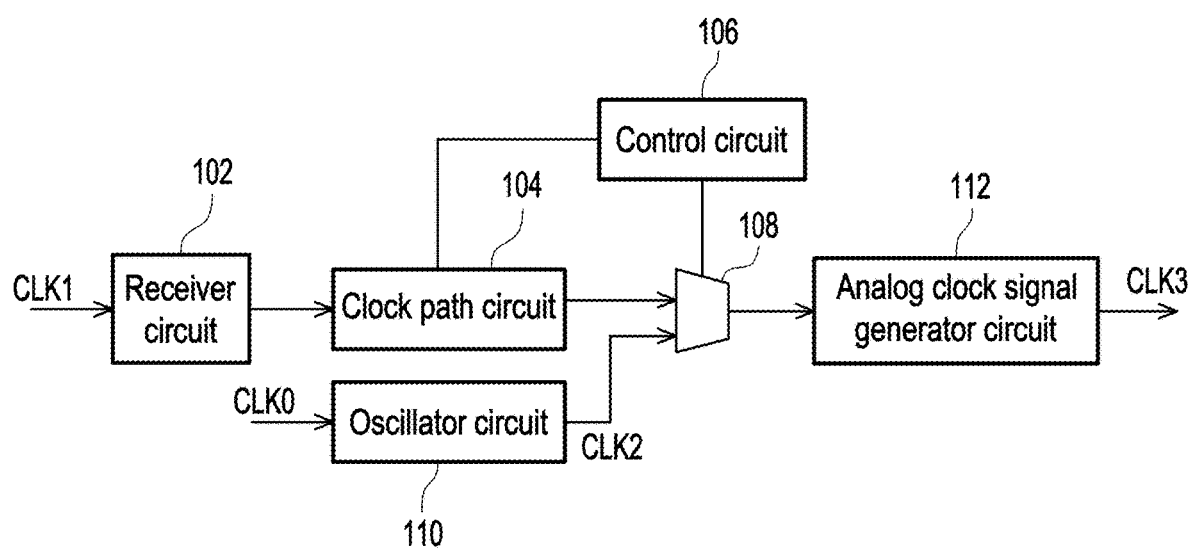
FIG. 1 and FIG. 2 are schematic diagrams of a clock signal generation circuit according to embodiments of the disclosure.

FIG. 1 is a schematic diagram of a clock signal generation circuit according to an embodiment of the disclosure. Referring to FIG. 1, the clock signal generation circuit may include a receiver circuit 102, a clock path circuit 104, a control circuit 106, a multiplexer circuit 108, an oscillator circuit 110, and an analog clock signal generator circuit 112. The clock path circuit 104 is coupled to input terminals of the receiver circuit 102, the control circuit 106, and the multiplexer circuit 108. The oscillator circuit 110 is coupled to another input terminal of the multiplexer circuit 108. A control terminal of the oscillator circuit 110 is coupled to the control circuit 106. An output terminal of the multiplexer circuit 108 is coupled to the analog clock signal generator circuit 112. The analog clock signal generator circuit 112 may be, for example, a 4-phase analog clock signal generator circuit, but the disclosure is not limited thereto. In other embodiments, the analog clock signal generator circuit 112 may also be an analog clock signal generator with a different phase number. The receiver circuit 102, the clock path circuit 104, the control circuit 106, the multiplexer circuit 108, the oscillator circuit 110, and the analog clock signal generator circuit 112 may be, for example, applied to a memory device, and implemented as integrated circuits, system-on-chips (SoC), chipsets, or chip assembly.

Figure 2:
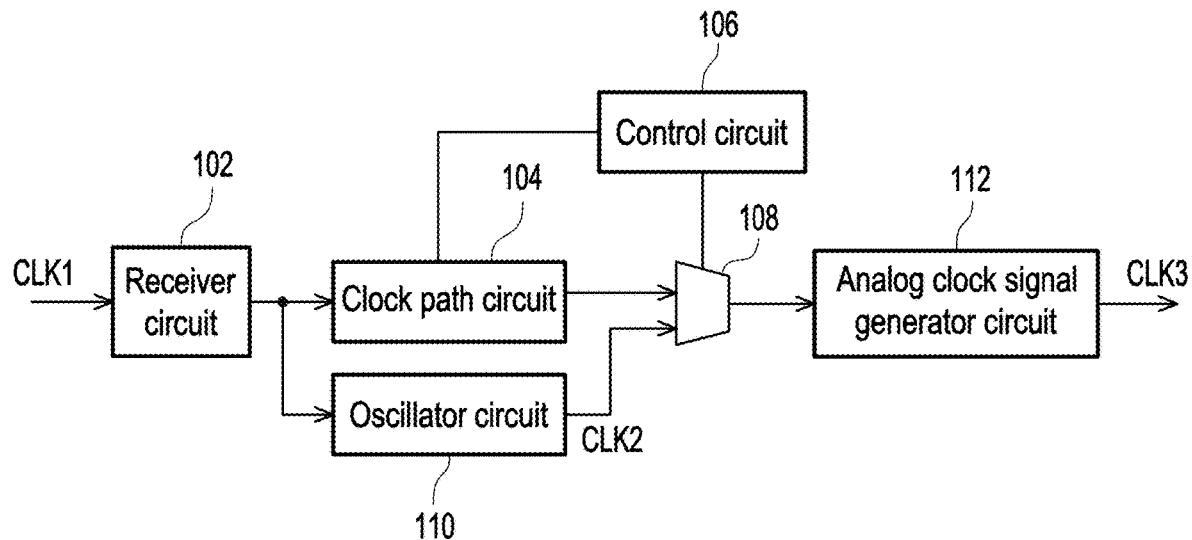

The receiver circuit 102 can receive an input clock signal CLK1 to transmit to the input terminal of the multiplexer circuit 108 through the clock path circuit 104. The oscillator circuit 110 is configured to receive an input clock signal CLK0 and provide an oscillator signal CLK2 with a same frequency as the input clock signal CLK1. The oscillator circuit 110 may be, for example, an injection locked oscillator (ILO) circuit or an annular oscillator circuit, but the disclosure is not limited thereto. For example, the oscillator circuit 110 may be coupled to an input terminal of the clock path circuit 104 as shown in FIG. 2 to provide the oscillator signal CLK2 according to the input clock signal CLK1. In other embodiments, the input clock signal CLKO received by the oscillator circuit 110 may also come from other circuits without being limited to the embodiment of FIG. 2.

The control circuit 106 may determine whether the analog clock signal generator circuit 112 provides the output clock signal CLK3, for example, by determining whether the analog clock signal generator circuit 112 enters an idle mode or a power-off mode. When the analog clock signal generator circuit 112 enters the idle mode or the power-off mode, it is determined that the analog clock signal generator circuit 112 does not provide the output clock signal; otherwise, it is determined that the analog clock signal generator circuit 112 provides the output clock signal. When the control circuit 106 determines that the analog clock signal generator circuit 112 does not provide the output clock signal, the control circuit 106 can control the multiplexer circuit 108 to selectively output the oscillator signal CLK2 to the analog clock signal generator circuit 112, and control the clock path circuit 104 to stop transmitting the input clock signal CLK1. In this way, when the analog clock signal generator circuit 112 does not need to provide the output clock signal, the oscillator circuit 110 is used instead of the clock path circuit 104 to provide the oscillator signal CLK2 with the same frequency as the input clock signal CLK1 to the analog clock signal generator circuit 112, and the clock path circuit 104 is configured to stop transmitting the input clock signal CLK1, thereby effectively reducing the power consumption of the clock signal generation circuit without affecting the normal operation of the clock signal generation circuit.

Figure 3:
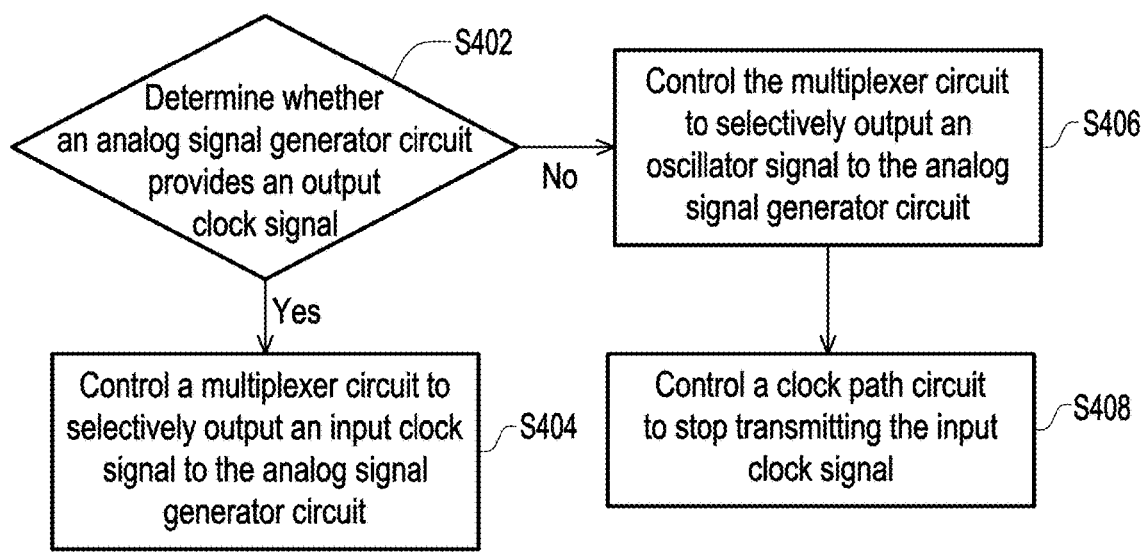
FIG. 3 is a flowchart of a clock signal generation method of a clock signal generation circuit according to an embodiment of the disclosure.

FIG. 3 is a flowchart of a clock signal generation method of a clock signal generation circuit according to an embodiment of the disclosure. The clock signal generation circuit includes the clock path circuit, the oscillator circuit, the multiplexer circuit, and the analog clock signal generator circuit. The clock path circuit and the oscillator circuit are coupled to the input terminal of the multiplexer circuit. The output terminal of the multiplexer circuit is coupled to the analog clock signal generator circuit. The oscillator circuit can be implemented as an annular oscillator circuit or an injection locked oscillator circuit, but the disclosure is not limited thereto. The clock path circuit is configured to transmit the input clock signal. It can be seen from the above embodiments that the clock signal generation method of the clock signal generation circuit may at least include the following steps. First, it is determined whether the analog clock signal generator circuit provides the output clock signal (step S402). For example, it can be determined whether the analog clock signal generator circuit enters the idle mode or the power-off mode. When the analog clock signal generator circuit enters the idle mode or the power-off mode, it is determined that the analog clock signal generator circuit does not provide the output clock signal. The analog clock signal generator circuit may be, for example, a 4-phase analog clock signal generator circuit, but the disclosure is not limited thereto. If the analog clock signal generator circuit provides the output clock signal, the multiplexer circuit is controlled to selectively output input clock signal to the analog clock signal generator circuit. The multiplexer circuit may, for example, be implemented as a multiplexer circuit, but the disclosure is not limited thereto. If it is determined that the analog clock signal generator circuit provides the output clock signal, the multiplexer circuit is controlled to selectively output the input clock signal provided by the clock path circuit to the analog clock signal generator circuit (step S404). If it is determined that the analog clock signal generator circuit does not provide the output clock signal, the multiplexer circuit is controlled to selectively output the oscillator signal to the analog clock signal generator circuit (step S406), and the clock path circuit is controlled to stop transmitting the input clock signal (step S408). The oscillator circuit can receive the input clock signal to generate the oscillator signal based on the input clock signal.

In summary, the control circuit of the embodiment of the disclosure can control the multiplexer circuit to selectively output the oscillator signal provided by the oscillator circuit to the analog clock signal generator circuit when the analog clock signal generator circuit does not provide the output clock signal, and control the clock path circuit to stop transmitting the input clock signal. In this way, when the analog clock signal generator circuit does not provide the output clock signal, the oscillator circuit is used instead of the clock path circuit to provide the oscillator signal with the same frequency as the input clock signal to the analog clock signal generator circuit, thereby effectively reducing the power consumption of the clock signal generation circuit.

The invention claimed is:
1. A clock signal generation circuit, comprising:
 a receiver circuit, configured to receive an input clock signal:
 a clock path circuit, coupled to the receiver circuit to transmit the input clock signal;

an oscillator circuit, configured to provide an oscillator signal with a same frequency as the input clock signal;

a multiplexer circuit, whose input terminal is coupled to the clock path circuit and the oscillator circuit;

an analog clock signal generator circuit, coupled to an output terminal of the multiplexer circuit to provide an output clock signal; and a control circuit, coupled to the clock path circuit and the multiplexer circuit, and configured to control the multiplexer circuit to selectively output the oscillator signal to the analog clock signal generator circuit, and control the clock path circuit to stop transmitting the input clock signal, when the analog clock signal generator circuit does not provide the output clock signal.

2. The clock signal generation circuit according to claim 1, wherein an input terminal of the oscillator circuit is coupled to an input terminal of the clock path circuit to generate the oscillator signal based on the input clock signal.

3. The clock signal generation circuit according to claim 1, wherein the oscillator circuit comprises an annular oscillator circuit or an injection locked oscillator circuit.

4. The clock signal generation circuit according to claim 1, wherein the analog clock signal generator circuit comprises a 4-phase analog clock signal generator circuit.

5. The clock signal generation circuit according to claim 1, wherein when the analog clock signal generator circuit enters an idle mode or a power-off mode, the control circuit determines that the analog clock signal generator circuit does not provide the output clock signal.

6. A clock signal generation method of a clock signal generation circuit, wherein the clock signal generation circuit comprises a clock path circuit, an oscillator circuit, a multiplexer circuit, and an analog clock signal generator circuit, the clock path circuit and the oscillator circuit are coupled to an input terminal of the multiplexer circuit, an output terminal of the multiplexer circuit is coupled to the analog clock signal generator circuit, and the clock path circuit is configured to transmit an input clock signal, the clock signal generation method of the clock signal generation circuit comprising:

determining whether the analog clock signal generator circuit provides an output clock signal;

in response to the analog clock signal generator circuit providing the output clock signal, controlling the multiplexer circuit to selectively output the input clock signal to the analog clock signal generator circuit; and in response to the analog clock signal generator circuit not providing the output clock signal, controlling the multiplexer circuit to selectively output an oscillator signal to the analog clock signal generator circuit, and controlling the clock path circuit to stop transmitting the input clock signal.

7. The clock signal generation method of the clock signal generation circuit according to claim 6, wherein an input terminal of the oscillator circuit receives the input clock signal to generate the oscillator signal based on the input clock signal.

8. The clock signal generation method of the clock signal generation circuit according to claim 6, wherein the oscillator circuit comprises an annular oscillator circuit or an injection locked oscillator circuit.

9. The clock signal generation method of the clock signal generation circuit according to claim 6, wherein the analog clock signal generator circuit comprises a 4-phase analog clock signal generator circuit.

10. The clock signal generation method of the clock signal generation circuit according to claim 6, wherein when the analog clock signal generator circuit enters an idle mode or a power-off mode, it is determined that the analog clock signal generator circuit does not provide the output clock signal.

\* \* \* \* \*